United States Patent
Wang et al.

(10) Patent No.: US 10,658,397 B2
(45) Date of Patent: May 19, 2020

(54) FLEXIBLE DISPLAY PANEL, MANUFACTURING METHOD OF FLEXIBLE DISPLAY PANEL AND DISPLAY APPARATUS

(71) Applicant: Wuhan China Star Optoelectronics Semiconductor Display Technology Co., Ltd., Wuhan, Hubei (CN)

(72) Inventors: Xing Wang, Guangdong (CN); Kun Yang, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 83 days.

(21) Appl. No.: 15/746,552

(22) PCT Filed: Dec. 22, 2017

(86) PCT No.: PCT/CN2017/118017
§ 371 (c)(1),
(2) Date: Oct. 25, 2018

(87) PCT Pub. No.: WO2019/090924
PCT Pub. Date: May 16, 2019

(65) Prior Publication Data
US 2019/0386040 A1    Dec. 19, 2019

(30) Foreign Application Priority Data
Nov. 8, 2017    (CN) .......................... 2017 1 1092567

(51) Int. Cl.
*H01L 27/12*    (2006.01)
*G02F 1/1362*    (2006.01)
(Continued)

(52) U.S. Cl.
CPC .... *H01L 27/1244* (2013.01); *G02F 1/136286* (2013.01); *H01L 27/1218* (2013.01);
(Continued)

(58) Field of Classification Search
None
See application file for complete search history.

(56) References Cited

U.S. PATENT DOCUMENTS

2019/0386040 A1* 12/2019 Wang ................... H01L 27/1244
2020/0058725 A1*  2/2020 Ka ...................... H01L 29/78618

FOREIGN PATENT DOCUMENTS

| CN | 106784384 A | 5/2017 |
| CN | 107170758 A | 9/2017 |
| KR | 20140080235 A | 6/2014 |

* cited by examiner

*Primary Examiner* — Jack S Chen
(74) *Attorney, Agent, or Firm* — Hemisphere Law, PLLC; Zhigang Ma

(57) ABSTRACT

A flexible display panel is provided, including a flexible base, a barrier layer, a buffer layer, an active layer and a gate insulating layer, a gate metal layer and a second insulating layer, a second metal layer and an interlayer insulating layer, a second interlayer insulating layer, and a source/drain metal layer; on the second interlayer insulating layer, a first via hole is formed to communicate with the source/drain metal layer and the active layer, and a second contact hole is formed to communicate with the source/drain metal layer and the second interlayer insulating layer. A manufacturing method of a flexible display panel and a display apparatus including the display panel are also provided. The disclosure can ensure the normal display of the flexible display panel during the bending process.

16 Claims, 3 Drawing Sheets

(51) Int. Cl.
*G02F 1/1333* (2006.01)
*G02F 1/1368* (2006.01)

(52) U.S. Cl.
CPC ...... *H01L 27/1248* (2013.01); *H01L 27/1259* (2013.01); *G02F 1/1368* (2013.01); *G02F 1/133305* (2013.01); *G02F 2001/136295* (2013.01)

FLEXIBLE DISPLAY PANEL, MANUFACTURING METHOD OF FLEXIBLE DISPLAY PANEL AND DISPLAY APPARATUS

RELATED APPLICATIONS

The present application is a National Phase of International Application Number PCT/CN2017/118017, filed Dec. 22, 2017, and claims the priority of China Application No. 201711092567.6, filed Nov. 8, 2017.

FIELD OF THE DISCLOSURE

The disclosure relates to a display apparatus, a flexible display panel, and a manufacturing method of the flexible display panel.

BACKGROUND

With the development of display panel technology, the display technology of flexible display panel has been rapidly developed in recent years. However, the titanium-aluminum-titanium wiring of the flexible display panel is easily broken during the bending process, resulting in the damage of the display panel. Liquid crystal displays are widely applied due to numerous advantages such as thin bodies, energy saving, and radiation-free. Most liquid crystal displays available on the market are backlight-type liquid crystal displays, and such liquid crystal display includes a liquid crystal panel and a backlight module. The working principle of the liquid crystal panel is placing liquid crystal molecules between two parallel glass substrates and loading a driving voltage on the two glass substrates to control rotation directions of the liquid crystal molecules, for refracting rays of the backlight module to generate images.

SUMMARY

In view of this, the disclosure provides a display apparatus, a flexible display panel and a manufacturing method thereof, and aims to solve the technical problem.

The disclosure provides a flexible display panel including a flexible base, a barrier layer formed on the flexible base, a buffer layer formed on the barrier layer, an active layer and a gate insulating layer formed on the buffer layer, a gate metal layer and a second insulating layer formed on the gate insulating layer, a second metal layer and an interlayer insulating layer formed on the second insulating layer, a second interlayer insulating layer formed on the interlayer insulating layer, and a source/drain metal layer formed on the second interlayer insulating layer; and a first via hole and a second contact hole is formed on the second interlayer insulating layer, the source/drain metal layer is in communication with the active layer through the first via hole, and the source/drain metal layer is in communication with the second interlayer insulating layer through the second contact hole.

A depth of the first via hole is greater than a depth of the second contact hole.

The first via hole penetrates through the second interlayer insulating layer, the interlayer insulating layer, the second insulating layer, and the gate insulating layer and stops at the active layer.

The second contact hole is a blind hole opened on the second interlayer insulating layer.

A number of the first via hole is two.

The number of the first via hole and a number of the second contact hole are equal.

The gate metal layer and the second metal layer are made of molybdenum, and the second interlayer insulating layer is made of polyimide.

The disclosure further provides a manufacturing method of a flexible display panel, and the flexible display panel includes a flexible base, and the manufacturing method includes the following steps:

forming a barrier layer on the flexible base, forming a buffer layer on the barrier layer, forming an active layer and a gate insulating layer on the buffer layer, forming a gate metal layer and a second insulating layer on the gate insulating layer, forming a second metal layer and an interlayer insulating layer on the second insulating layer, forming a second interlayer insulating layer on the interlayer insulating layer, and forming a source/drain metal layer on the second interlayer insulating layer; and forming a first via hole and a second contact hole on the second interlayer insulating layer, and the first via hole is in communication with the source/drain metal layer and the active layer, and the second contact hole is in communication with the source/drain metal layer and the second interlayer insulating layer.

The disclosure also provides a display apparatus including the flexible display panel.

In the display apparatus, the flexible display panel, and the manufacturing method thereof according to the disclosure, by providing a first via hole and a second contact hole having different depths on the second interlayer insulating layer, the display panel not easily broken during the bending process can be ensured, thereby ensuring the normal display of the flexible display panel during the bending process.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following sections offer a clear, complete description of this disclosure in combination with the embodiments and accompanying drawings. Obviously, the embodiments described herein are only a part of, but not all of the embodiments of this disclosure. In view of the embodiments described herein, any other embodiment obtained by those of ordinary skill in the art skilled in this art without offering creative effort is included in a scope claimed by this disclosure.

Figure 1:
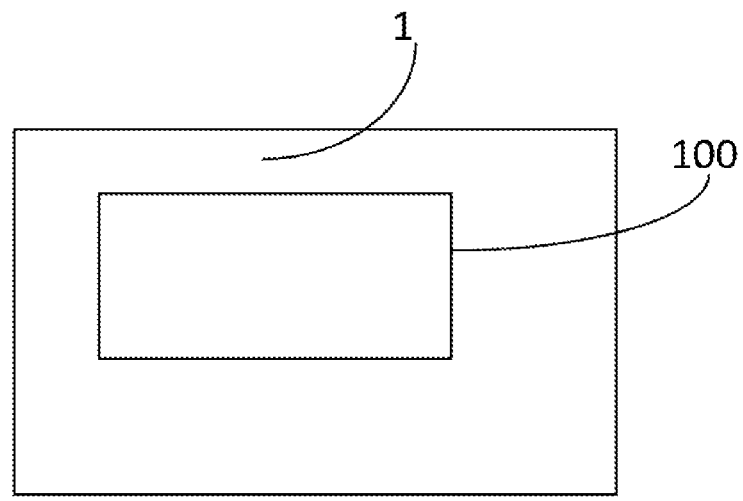
FIG. 1 is a block diagram of a display apparatus according to an embodiment of the disclosure.
Figure 2:
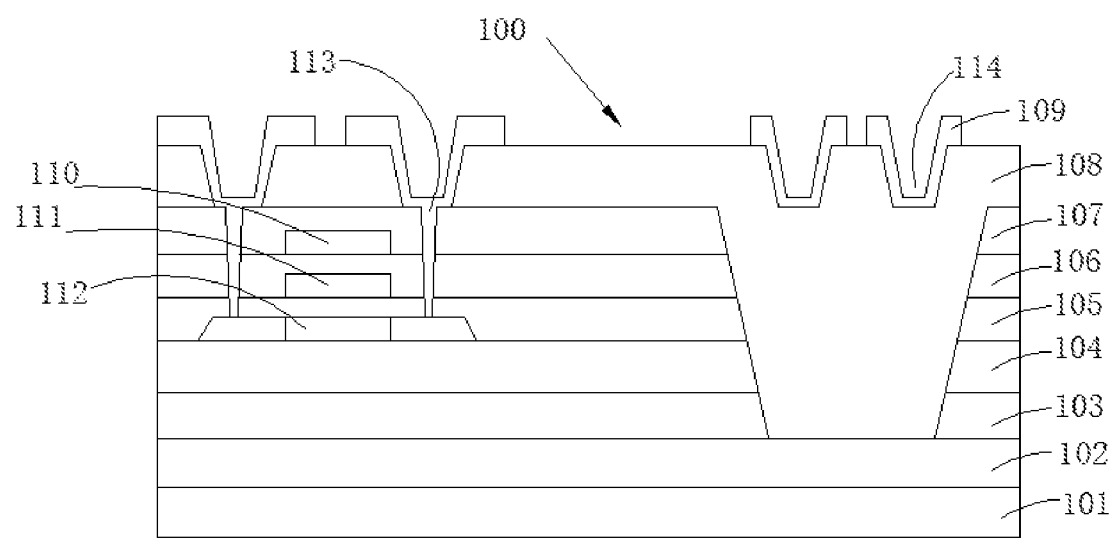
FIG. 2 is a schematic structural diagram of a flexible display panel according to an embodiment of the disclosure.

As shown in FIGS. 1 to 2, which are schematic diagrams of a display apparatus 1 in an embodiment of the disclosure. In this embodiment, the display apparatus 1 may be a liquid crystal display, a liquid crystal television, a cell phone, a tablet computer or the like. The display apparatus 1 includes a flexible display panel 100. The flexible display panel 100 includes a transparent glass substrate 101, a flexible base 102 coated on the transparent glass substrate 101, a barrier layer 103 formed on the flexible base 102, a buffer layer 104 formed on the barrier layer 103, the active layer 112 and a gate insulating layer 105 formed on the buffer layer 104, a gate metal layer 111 and a second insulating layer 106 formed on the gate insulating layer 105, a second metal layer 110 and an interlayer insulating layer 107 formed on the second insulating layer 106, a second interlayer insulating layer 108 formed on the interlayer insulating layer 107, and a source/drain metal layer 109 formed on the second interlayer insulating layer 108. In the present embodiment, the active layer 112 is disposed between the buffer layer 104 and the gate insulating layer 105, the gate metal layer 111 is disposed between the gate insulating layer 105 and the second insulating layer 106, and the second metal layer 110 is disposed between the second insulating layer 106 and the interlayer insulating layer 107.

In the present embodiment, the source/drain metal layer 109 is made of titanium and aluminum. An insulating layer pattern is formed on the second interlayer insulating layer 108 by a Halftone mask. The flexible substrate 102 has a thickness of 10-20 µm. The barrier layer 103 has a thickness of 500-1000 nm, the buffer layer 104 has a thickness of 200-300 nm, the active layer 112 has a thickness of 40-50 nm, the gate insulating layer 105 has a thickness of 50-200 nm, and the gate metal layer 111 has a thickness of 150-250 nm. The second insulating layer 106 has a thickness of 50-200 nm and the second metal layer 110 has a thickness of 150-250 nm. The interlayer insulating layer 107 has a thickness of 500-700 nm and the second insulating layer 108 has a thickness of 1.0-3 µm, and the source/drain metal layer 109 has a thickness of 400-600 nm. The gate metal layer 111 and the second metal layer 110 are made of molybdenum, and the second interlayer insulating layer 108 is made of polyimide.

A first via hole 113 and a second contact hole 114 are formed on the second interlayer insulating layer 108. In this embodiment, a number of the first via hole 113 is two, and the number of the first via hole 113 and a number of the second contact hole 114 are equal. In other embodiments, the number of the first via hole 113 and the number of the second contact hole 114 can be set differently according to different sizes, shapes, structures, or other related parameters of the flexible display panel. In the present embodiment, the shapes of the first via hole 113 and the second contact hole 114 may be the same or different. The specific shape may be circular or square, but the disclosure is not limited thereto. A depth of the first via hole 113 is greater than that of the second contact hole.

The source/drain metal layer 109 is in communication with the active layer 112 through the first via hole 113, and the source/drain metal layer 109 is in communication with the second interlayer insulating layer 108 through the second contact hole 114; in this way, during the bending process of the display panel 100, the wiring of the titanium aluminum titanium can not be easily broken, thereby ensuring the normal display of the flexible display panel during the bending process. Specifically, the first via hole 113 penetrates through the second interlayer insulating layer 108, the interlayer insulating layer 107, the second insulating layer 106, and the gate insulating layer 105 and stops at the active layer 112; and the second contact hole 114 is a blind hole opened on the second interlayer insulating layer 108.

Figure 3:
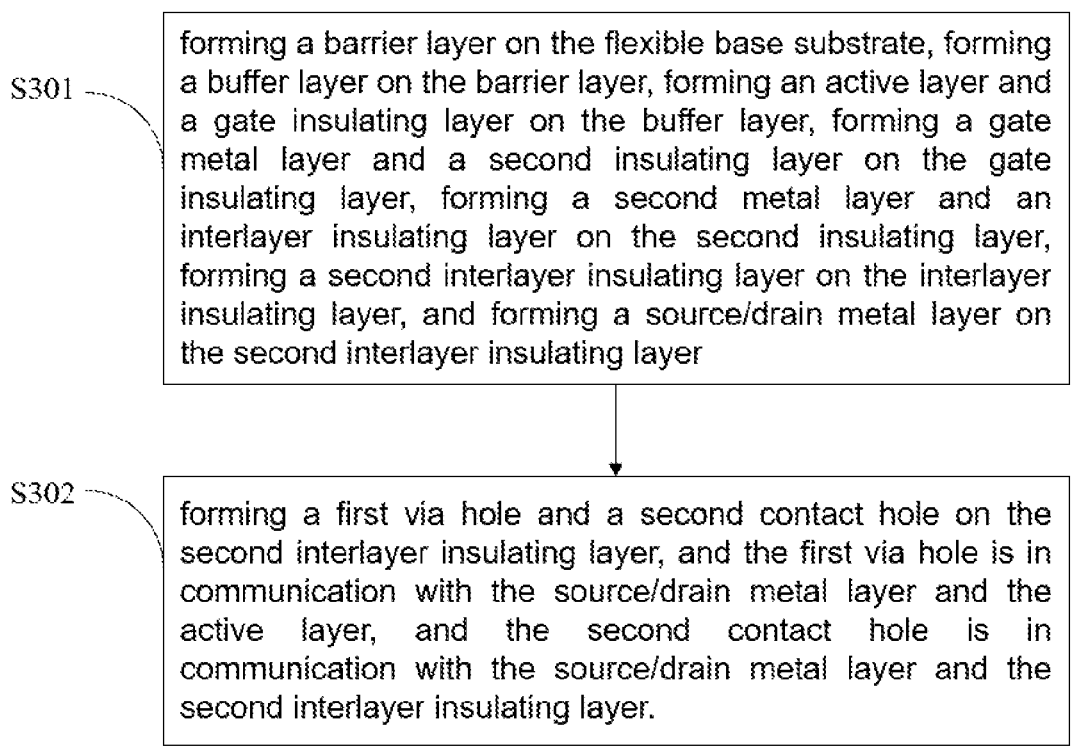
FIG. 3 is a flowchart of a manufacturing method of the flexible display panel of the disclosure.

As shown in FIG. 3, the manufacturing method of the flexible display panel of the disclosure includes the following steps:

step S301: forming a barrier layer 103 on the flexible base, forming a buffer layer 104 on the barrier layer 103, forming an active layer 112 and a gate insulating layer 105 on the buffer layer 104, forming a gate metal layer 111 and a second insulating layer 106 on the gate insulating layer 105, forming a second metal layer 110 and an interlayer insulating layer 107 on the second insulating layer 106, forming a second interlayer insulating layer 108 on the interlayer insulating layer 107, and forming a source/drain metal layer 109 on the second interlayer insulating layer 108.

Step S302: forming a first via hole 113 and a second contact hole 114 on the second interlayer insulating layer 108, and the first via hole 113 being in communication with the source/drain metal layer 109 and the active layer 112, the second contact hole 114 being in communication with the source/drain metal layer 109 and the second interlayer insulating layer 108.

In the flexible display panel 100 of the disclosure, by providing a first via hole 113 and a second contact hole 114 having different depths on the second interlayer insulating layer 108, the display panel 100 not easily broken during the bending process can be ensured, thereby ensuring the normal display of the flexible display panel during the bending process.

The above is only the preferred embodiments of the disclosure, and certainly can not be used to limit the scope of the disclosure. Those skilled in the art may understand that all or part of the processes of the above embodiments may be implemented and that the claims of the disclosure equivalent changes are still within the scope of the disclosure.

What is claimed is:

1. A flexible display panel comprising:
    a flexible base;
    a barrier layer formed on the flexible base;
    a buffer layer formed on the barrier layer;
    an active layer and a gate insulating layer formed on the buffer layer;
    a gate metal layer and a second insulating layer formed on the gate insulating layer;
    a second metal layer and an interlayer insulating layer formed on the second insulating layer;
    a second interlayer insulating layer formed on the interlayer insulating layer; and
    a source/drain metal layer formed on the second interlayer insulating layer;
    wherein a first via hole and a second contact hole are formed on the second interlayer insulating layer, the source/drain metal layer is in communication with the active layer through the first via hole, and the source/drain metal layer is in communication with the second interlayer insulating layer through the second contact hole.

2. The flexible display panel according to claim 1, wherein a depth of the first via hole is greater than a depth of the second contact hole.

3. The flexible display panel according to claim 1, wherein the first via hole penetrates through the second interlayer insulating layer, the interlayer insulating layer, the second insulating layer, and the gate insulating layer and stops at the active layer.

4. The flexible display panel according to claim 1, wherein the second contact hole is a blind hole opened on the second interlayer insulating layer.

5. The flexible display panel according to claim 1, wherein a number of the first via hole is two.

6. The flexible display panel according to claim 5, wherein the number of the first via hole and a number of the second contact hole are equal.

7. The flexible display panel according to claim 1, wherein the gate metal layer and the second metal layer are made of molybdenum, and the second interlayer insulating layer is made of polyimide.

8. A manufacturing method of a flexible display panel, wherein the flexible display panel comprises a flexible base, and the manufacturing method comprises the following steps:
    forming a barrier layer on the flexible base;
    forming a buffer layer on the barrier layer;
    forming an active layer and a gate insulating layer on the buffer layer;
    forming a gate metal layer and a second insulating layer on the gate insulating layer;
    forming a second metal layer and an interlayer insulating layer on the second insulating layer;
    forming a second interlayer insulating layer on the interlayer insulating layer;
    forming a source/drain metal layer on the second interlayer insulating layer; and
    forming a first via hole and a second contact hole on the second interlayer insulating layer;
    wherein the first via hole is in communication with the source/drain metal layer and the active layer, and the second contact hole is in communication with the source/drain metal layer and the second interlayer insulating layer.

9. The manufacturing method of the flexible display panel according to claim 8, wherein a depth of the first via hole is greater than a depth of the second contact hole.

10. A display apparatus, comprising:
    a flexible display panel comprising:
    a flexible base;
    a barrier layer formed on the flexible base;
    a buffer layer formed on the barrier layer;
    an active layer and a gate insulating layer formed on the buffer layer;
    a gate metal layer and a second insulating layer formed on the gate insulating layer;
    a second metal layer and an interlayer insulating layer formed on the second insulating layer;
    a second interlayer insulating layer formed on the interlayer insulating layer, and
    a source/drain metal layer formed on the second interlayer insulating layer;
    wherein a first via hole and a second contact hole are formed on the second interlayer insulating layer, the source/drain metal layer is in communication with the active layer through the first via hole, and the source/drain metal layer is in communication with the second interlayer insulating layer through the second contact hole.

11. The display apparatus according to claim 10, wherein a depth of the first via hole is greater than a depth of the second contact hole.

12. The display apparatus according to claim 10, wherein the first via hole penetrates through the second interlayer insulating layer, the interlayer insulating layer, the second insulating layer, and the gate insulating layer and stops at the active layer.

13. The display apparatus according to claim 10, wherein the second contact hole is a blind hole opened on the second interlayer insulating layer.

14. The display apparatus according to claim 10, wherein a number of the first via hole is two.

15. The display apparatus according to claim 14, wherein the number of the first via hole and a number of the second contact hole are equal.

16. The display apparatus according to claim 10, wherein the gate metal layer and the second metal layer are made of molybdenum, and the second interlayer insulating layer is made of polyimide.

* * * * *